United States Patent
Chang et al.

(10) Patent No.: US 10,429,729 B2
(45) Date of Patent: Oct. 1, 2019

(54) EUV RADIATION MODIFICATION METHODS AND SYSTEMS

(71) Applicant: Taiwan Semiconductor Manufacturing Co., Ltd., Hsinchu (TW)

(72) Inventors: Chun-Lin Louis Chang, Hsinchu County (TW); Jen-Hao Yeh, Hsinchu (TW); Tzung-Chi Fu, Miaoli (TW); Bo-Tsun Liu, Taipei (TW); Li-Jui Chen, Hsinchu (TW); Po-Chung Cheng, Chiayi County (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 15/883,234

(22) Filed: Jan. 30, 2018

(65) Prior Publication Data

US 2018/0314145 A1 Nov. 1, 2018

Related U.S. Application Data

(60) Provisional application No. 62/491,363, filed on Apr. 28, 2017.

(51) Int. Cl.
| | |
|---|---|
| *G03F 1/24* | (2012.01) |
| *G03F 7/20* | (2006.01) |
| *H01L 21/027* | (2006.01) |
| *H05G 2/00* | (2006.01) |

(52) U.S. Cl.
CPC ............ *G03F 1/24* (2013.01); *G03F 7/70025* (2013.01); *G03F 7/70033* (2013.01); *H01L 21/0275* (2013.01); *H05G 2/00* (2013.01)

(58) Field of Classification Search
CPC ...... G03F 1/24; G03F 7/70025; G03F 7/0033; H01L 21/0275; H05G 2/00
USPC .......................................... 250/493.1, 504 R
See application file for complete search history.

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,828,625 B2 | 9/2014 | Lu et al. |
| 8,841,047 B2 | 9/2014 | Yu et al. |
| 8,877,409 B2 | 11/2014 | Hsu et al. |
| 9,093,530 B2 | 4/2015 | Huang et al. |
| 9,184,054 B1 | 11/2015 | Huang et al. |
| 9,256,123 B2 | 2/2016 | Shih et al. |
| 9,529,268 B2 | 12/2016 | Chang et al. |
| 9,548,303 B2 | 1/2017 | Lee et al. |
| 2012/0241649 A1* | 9/2012 | Nishihara ............... H05G 2/003 250/504 R |

(Continued)

*Primary Examiner* — Nicole M Ippolito
(74) *Attorney, Agent, or Firm* — Haynes and Boone, LLP

(57) ABSTRACT

A method and system for generating EUV light includes providing a laser beam having a Gaussian distribution. This laser beam can be then modified from a Gaussian distribution to a ring-like distribution. The modified laser beam is provided through an aperture in a collector and interfaces with a moving droplet target, which generates an extreme ultraviolet (EUV) wavelength light. The generated EUV wavelength light is provided to the collector away from the aperture. In some embodiments, a mask element may also be used to modify the laser beam to a shape.

20 Claims, 9 Drawing Sheets

(56) References Cited

U.S. PATENT DOCUMENTS

2015/0085264 A1* 3/2015 Chien .................. G03F 7/2008
                                                                        355/30
2017/0299857 A1* 10/2017 Kurosawa ............ G02B 26/023

* cited by examiner

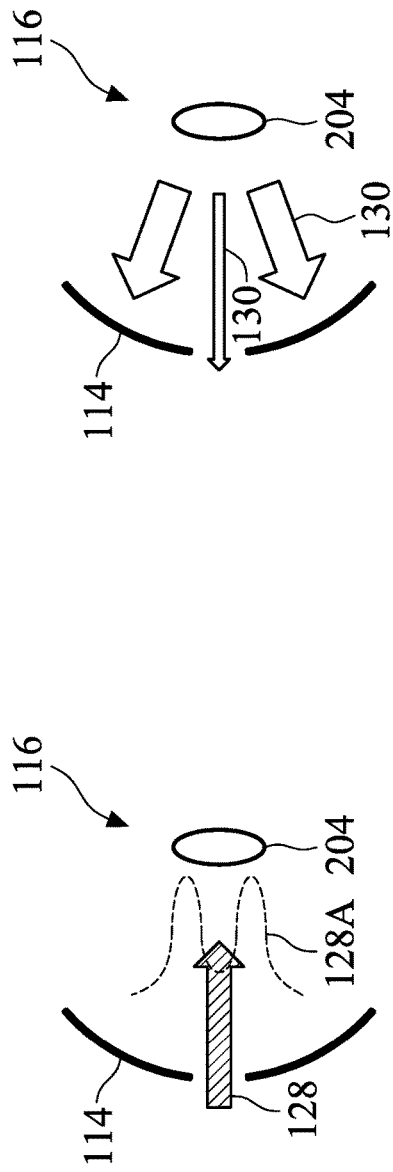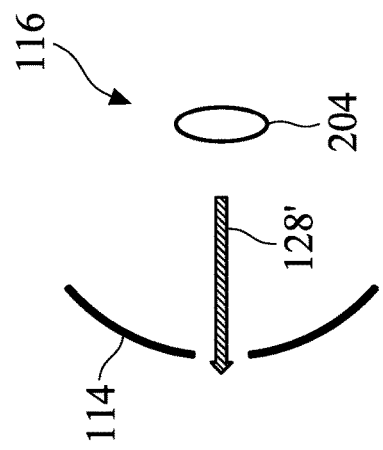

EUV RADIATION MODIFICATION METHODS AND SYSTEMS

CROSS-REFERENCE TO RELATED APPLICATION

This application claims the benefit of U.S. Provisional Application No. 62/491,363, filed Apr. 28, 2017, the entire contents of which are hereby incorporated by reference.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, semiconductor lithography processes may use lithographic templates (e.g., photomasks or reticles) to optically transfer patterns onto a substrate. Such a process may be accomplished, for example, by projection of a radiation source, through an intervening photomask or reticle, onto the substrate having a photosensitive material (e.g., photoresist) coating. The minimum feature size that may be patterned by way of such a lithography process is limited by the wavelength of the projected radiation source. In view of this, extreme ultraviolet (EUV) radiation sources and lithographic processes have been introduced.

However, generating the EUV light (or radiation) for EUV system can be an energy intensive and difficult process to control. In some EUV systems, for example, which utilize a plasma to generate the EUV radiation there can be a substantial energy waste. The wasted EUV radiation not only is costly in efficiency, but also generates a heat that requires dissipation. Thus, EUV light generation systems have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, 2C, and 2D are exemplary diagrammatic views of an EUV light source system including a laser beam impacting a particle or droplet and generation of EUV light therefrom, in accordance with some embodiments;

DETAILED DESCRIPTION

Figure 1:
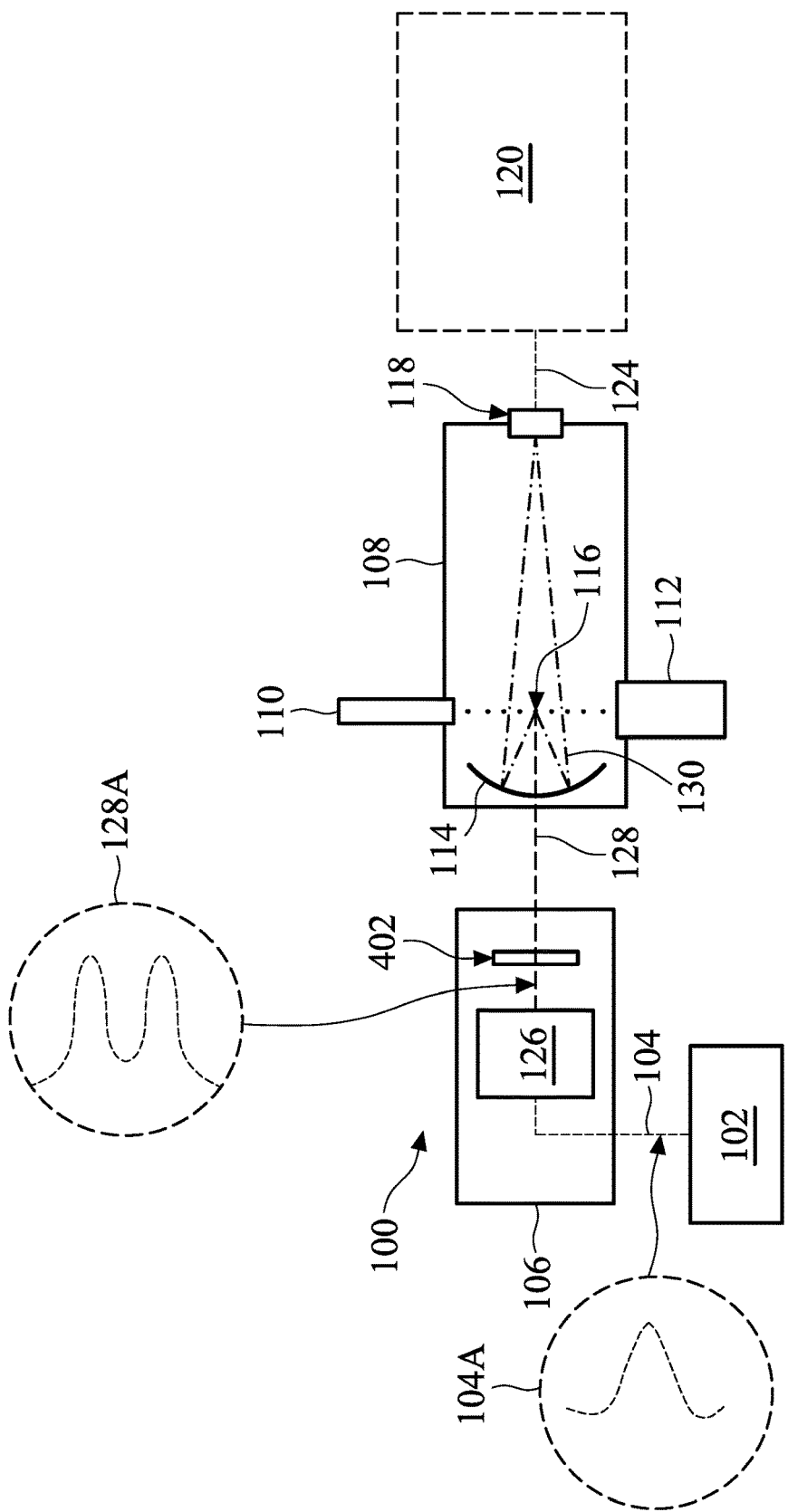
FIG. 1 is a schematic view of an EUV light (also referred to as EUV radiation) source system, including an exemplary EUV vessel, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the minimum feature size of semiconductor integrated circuits (ICs) has continued to shrink, there has continued to be a great interest in photolithography systems and processes using radiation sources with shorter wavelengths. In view of this, extreme ultraviolet (EUV) radiation sources, processes, and systems (e.g., such as the lithography system 700 discussed with reference to FIG. 7) have been introduced. However, to make use of such system, light (or radiation) have a wavelength in the EUV spectrum must be generated.

Referring to FIG. 1, illustrated therein is a schematic view of a EUV light source. The EUV light source 100 of FIG. 1 is illustrative of an exemplary system that creates EUV wavelength radiation, which can be delivered to a lithography system such as described in FIG. 7. In some embodiments, a EUV light source 100 may include a laser produced plasma (LPP) EUV light source. Thus, as shown and in some embodiments, the EUV light source 100 may include a pulsed laser source 102 (e.g., such as a $CO_2$ laser) that generates a laser beam 104. The laser source 102 may be a gas discharge CO2 laser source (e.g., producing radiation at about 10.6 μm). In other embodiments, other types of lasers may be suitable. The laser beam 104 may then be directed, by a beam transport and/or focus system 106, to a EUV vessel 108. The chamber represented by the box 106 of FIG. 1 may include various devices to perform various functions including beam transport, beam focusing, beam amplification, and/or other suitable functionality. In some embodiments, the beam transport and/or focus system 106 is collocated with (e.g., within a chamber with or adjoining) the EUV vessel 108. In some embodiments, the laser beam may travel (e.g., under vacuum environment) between the beam transport and/or focus system 106 and the EUV vessel 108. In various embodiments, the EUV vessel 108 also includes a droplet generator 110 and a droplet catcher 112. In some cases, the droplet generator 110 provides droplets (such as tin or a tin compound, discussed further below) into the EUV vessel 108.

In addition, the EUV vessel 108 may include one or more optical elements such as a collector 114. The collector 114 may also be referred to as a collector plate 114. In some embodiments, the collector 114 may include a normal incidence reflector, for example, implemented as a multilayer mirror (MLM). For example, the collector 114 may include a silicon carbide (SiC) substrate coated with a Mo/Si multilayer. In some cases, one or more barrier layers may be formed at each interface of the MLM, for example, to block thermally-induced interlayer diffusion. In some examples, other substrate materials may be used for the collector 114 such as Al, Si, or other type of substrate materials. The collector 114 may be an ellipsoid-shape with an aperture (or opening) at the center to allow the laser beam 104 to pass through and reach the irradiation region 116. Thus, in some embodiments, the laser beam passes through the aperture of the collector 114 and irradiates droplets generated by the droplet generator 110, thereby producing a plasma at an irradiation region 116. In some embodiments, the collector 114 may have a first focus at the irradiation region 116 and a second focus at an intermediate focus region 118. By way of example, the plasma generated at the irradiation region 116 produces EUV light 124 collected by the collector 114 and output from the EUV vessel 108 through the intermediate focus region 118. From there, the EUV light 124 may be transmitted to an EUV lithography system 120 for processing of a semiconductor substrate (e.g., such as discussed with reference to FIG. 7).

The laser beam 104 may be generated by the source 102 and provided from the source 102 with a Gaussian distribution in a transverse plane. In some systems, the laser beam 104 with the Gaussian distribution enters the irradiation region 116 and may be incident a tin droplet. However, this impact by a Gaussian distribution beam may not be ideal, including for example with respect to the tin droplet shape. Thus, presented in the present disclosure in some embodiments are methods and devices that provide for modifying the laser beam 104 providing for example, a variation in the distribution of intensity of the beam—also referred to a shape of the beam. Some of the beam shaping devices and methods may increase the collection efficiency, reduce undesired reflection, and/or save collector wear.

In some embodiments, the laser beam from the source is modified by shaping the beam; the shaping may be performed between the laser source 102 and the irradiation region 116. In some embodiments, the shaping of the beam is performed after the beam passes through portions of a beam transport and/or focus system (e.g., such as beam transport and/or focus system 106) and prior to the irradiation region 116. The EUV light source 100 includes an exemplary beam shaping unit 126. In some embodiments, the beam shaping unit 126 may be located anywhere in the system 100 such that the beam 104 from the source 102 enters the beam shaping unit 126 prior to the collector 114 or irradiation region 116. In some embodiments, the beam shaping unit 126 may be located in the system 100 such that the beam 104 from the source 102 enters the beam shaping unit 126 prior to the focal unit (e.g., mirror) that directs the beam to the irradiation region 116.

In an embodiment, the beam shaping unit 126 is operable to modify or transform the beam 104 from a Gaussian distribution in the transverse plane (as provided by the source 102), to a ring-shaped (or ring-profiled) semi-Gaussian beam in the transverse plane. (This may also be referred to as a "donut" shape.) In some embodiments, this transformation is accomplished by an inner and outer cone of a reflaxicon, as discussed in further detail below. A reflaxicon, or reflective axicon, can be a specialized lens-type system that can transform a beam into another shape, like a ring.

Figure 3A:
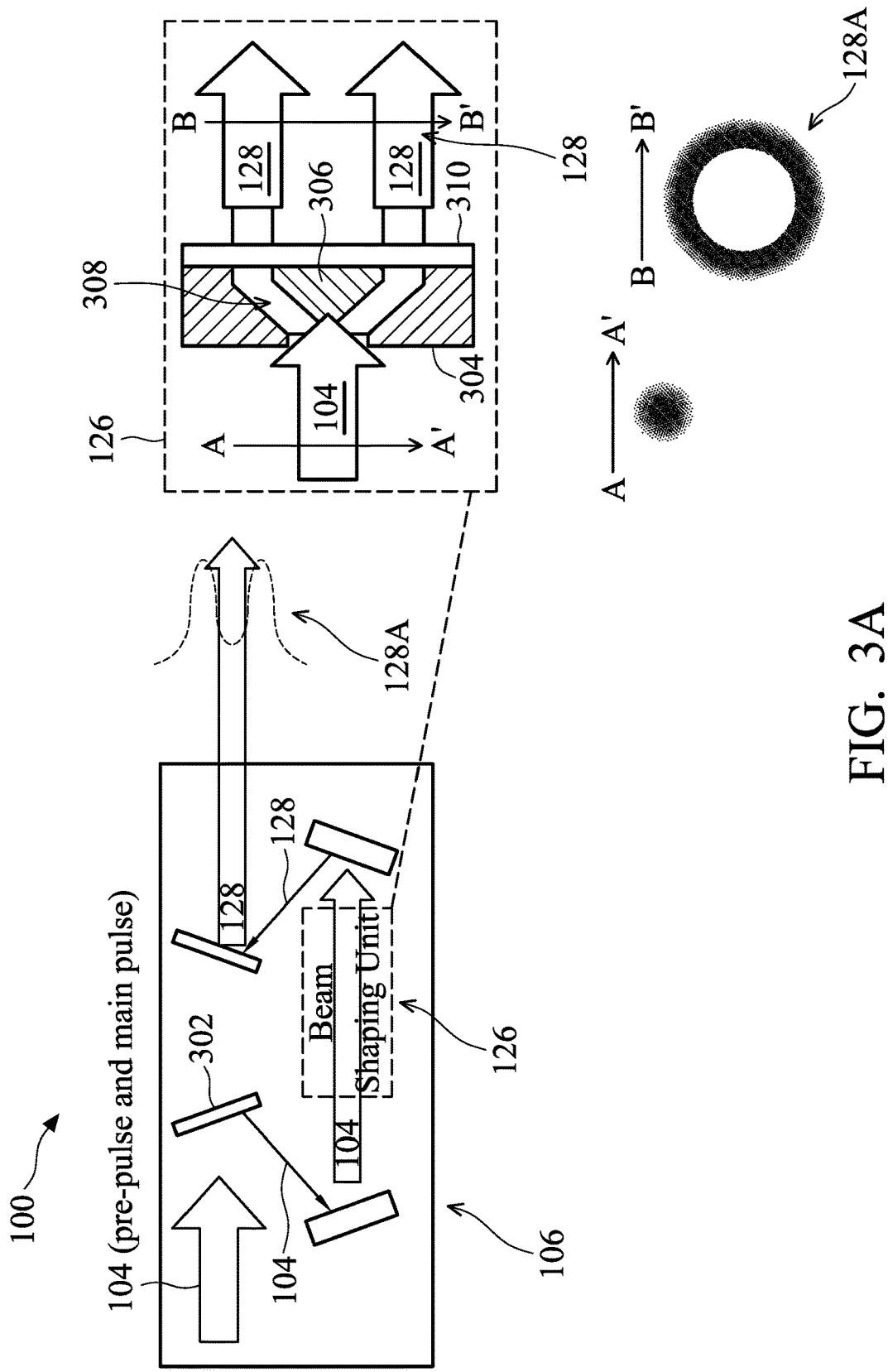
FIGS. 3A, 3B are an exemplary diagrammatic views of an embodiment of a beam transport and/or focus system of an EUV light source system, in accordance with some embodiments.

Referring to the example of FIG. 1, the effects of the beam shaping unit 126 are illustrated. The laser beam 104 having a Gaussian destruction, which is illustrated as shape (or distribution) 104A, is provided to the beam shaping unit 126. The shape 104A is circular in the cross-section (along a z-axis) as illustrated in FIG. 3A/3B. While the beam shaping unit 126 has an input of the shape 104A, the unit 126 outputs a modified beam specifically, a shaped beam 128. The shaped beam 128 has a ring-like, semi-Gaussian shape or distribution 128A (also referred to as "donut" shaped). Thereafter, the shaped laser beam 128 is provided to the irradiation region 116. In some embodiments, the shaped laser beam 128 has a ring-shaped semi-Gaussian beam in the transverse plan as a distribution, illustrated as 128A when it impacts the stream of droplets/mist in the irradiation region 116.

The beam transport and/or focus system 106 may in some embodiments include a mask element 402 that provides for patterning the laser beam prior to being incident the stream of droplets/mists in the irradiation region. The mask element 402 may block off portions of the beam, including, for example, deflecting portions of the shaped beam 128. The mask element may include a beam dump such as a water-cooled beam dump. In some embodiments, the laser beam is defected into a beam dump (e.g., water cooled beam dump), while the non-deflected portion is provided as shaped beam 128A. In an embodiment, the mask element 402 includes a deflecting wedge (see 402A of FIG. 4). The wedge 402A may be included in conjunction with the beam dump. For example, the wedge 402A may deflect a beam portion into the beam dump (e.g., water-cooled beam dump). The mask element 402 and the beam shaping unit 126 may be implemented concurrently in the EUV light source 100. In other embodiments, one of the mask element 402 or the beam shaping unit 126 may be omitted. As discussed above, the laser beam 104 enters the beam shaping unit 126 and exits as shaped beam 128. As also discussed above, in an embodiment, the laser beam 104 has a Gaussian distribution shape 104A and the shaped laser beam 128 has a ring-shaped beam 128A. More specifically, the shaped laser beam 128 may be incident the mask element 402, which may further modify the beam by patterning the ring-shaped beam such that one or more portions of the ring-shaped beam are deflected as discussed further below. In other embodiments, the beam shaping unit 126 is omitted and the mask element 402 may modify the beam 104 having the Gaussian distribution shape 104A to deflect one or more portions of that beam.

In some embodiments, at least one focusing element (e.g., mirror) is disposed in the chamber of the beam transport and/or focus system 106 between the beam shaping unit 126 and the collector 114. In some embodiments, at least one focusing element (e.g., mirror) is disposed between the mask element 402 and the collector 114. This element may be a portion of plurality of elements referred to as a final focusing assembly, which is discussed further below.

In some embodiments, the shaped beam 128 (with or without the patterning provided by the mask element) then irradiates (e.g., impacts) a droplet in the irradiation region 116. This irradiation provides a reflected portion 130 of EUV light, which is directed by the collector 114 to the intermediate focal point 118. Details of this interaction are described in greater detail below with reference to FIGS. 2A, 2B, and 2C. The EUV light 130 is generated by converting a material droplet (liquid or mist) into a plasma state when the material has an element, e.g., xenon, lithium or tin, indium, antimony, tellurium, aluminum, etc., with an emission line in the EUV spectrum.

The generated EUV light, illustrated as reflected portions 130, are electromagnetic radiation having wavelengths of around 50 nm or less (also sometimes referred to as soft x-rays), and including light at a wavelength centered around about 13.5 nm. The generated EUV light can be used in photolithography processes to produce features on target substrates such as discussed below.

Referring to FIG. 2A, illustrated are diagrammatic views of portions of an EUV vessel 108, which provide further details that may be applied to the system of FIG. 1. FIG. 2A shows a diagrammatic view of including the collector 114 and an entry of the shaped laser beam 128 through the collector aperture and incident a droplet 204 in the irradiation region 116. A final mirror of the preceding system (e.g., focusing unit 106) is illustrated as mirror 202. As discussed herein, in embodiments of the traditional systems, the mirror 202 can be impacted by the EUV irradiation through the collector 114 central hole and also impacted by a thermal effect from absorption of the EUV irradiation and backward CO2 radiation.

The droplet 204 may be spherical in shape or ellipsoidal in shape. As discussed below, the droplet 204 may be a liquid droplet or in mist form. The droplet 204 may be tin or a tin compound. Example compositions include, but are not limited to, tin, $SnBr_4$, $SnBr_2$, $SnH_4$, tin-gallium alloys, tin-indium alloys, tin-indium-gallium alloys or combinations thereof. The distribution (or shape) 128A of the laser beam 128 illustrates the peak amplitude of the beam with respect to a vertical axis of 0. As discussed above, the beam 128 has a ring-shaped semi-Gaussian beam in the transverse plane. In an embodiment, the shape 128A is to scale with respect to the (tin) droplet 204 as illustrated in FIG. 2A. That is, the high amplitude points of the distribution 128A are incident an edge region of the droplet 204, while a low amplitude portion is incident a center region of the droplet 204. The distribution 128A provides a ring-shape in the cross-section such as illustrated with respect to FIGS. 3A/3B. As such, the high amplitude regions may be incident the edge region around the circumference of the droplet 204. The distribution 128A may provide a larger incident surface area on the droplet 204 than that of a Gaussian-shaped beam would have provided. This is furthered by allowing more contact with the curved surface of the droplet 204. Because of the larger surface area of the shaped beam 128 (e.g., as compared to a Gaussian beam) onto the droplet 204, a higher percentage of reflection of the EUV light to the collector 114 for collection can be achieved. It is again noted that the shaped beam 128 can be implemented for a pre-pulse (PP) or main pulse of the laser. As such, in some embodiments, the shaped beam 128 is incident a liquid droplet; in some embodiments, the shaped beam 128 is incident a mist form "droplet". During a method of EUV generation, the shaped beam 128 may be incident droplets in both forms (e.g., PP followed by a MP).

FIG. 2B is a sequential diagrammatic view provided after the beam 128 is incident the droplet 204. It is noted that in some embodiments, a pre-pulse is incident a droplet 204 (e.g., tin liquid droplet) and a main pulse is incident a "droplet" 204 in mist form (e.g., expanding a droplet to form a mist such as expanding tin mist). Again, for ease of reference and understanding, the contacted material is referred to as a "droplet" 204, which may refer to either mist form or liquid droplet form. FIG. 2B illustrates a reflected EUV light 130 generated from the interaction of beam 128 to the droplet/mist 204. That is, the laser beam 128 goes through the hole of the collector 114 and impacts with the droplets (mist) such as illustrated by droplet (mist) 204. The droplets (mists) 204 (e.g., tin) plasmas are generated and irradiate EUV emission, illustrated as EUV light 130. In some embodiments, as the laser beam 128 provides a ring-shaped surface area of impact to the droplet/mist 204 in one or both of the pre-pulse and main pulse, the EUV light generated also is formed in a ring-shaped profile. Thus, the aperture or hole of the collector 114 may fall within the center of the ring-shaped profile of EUV light. As illustrated in FIG. 2B, the reflected EUV light 130 is greater off-horizontal axis than on-horizontal axis. That is the angular distribution of the reflected EUV light 130 is increased. This can increase the efficiency as the on-horizontal axis light can be considered wasted in the system as it is not captured and directed to the focal point 118 by the collector 114 but traverses back through the aperture. It is noted that in an exemplary embodiment, the collector 114 may be approximately 24 inches in diameter with a 4 inch diameter hole in the center. The reflected EUV light 130 is angularly distributed such that it is incident the mirrored surface of the collector 114 (as opposed reflecting to the opening in the collector). The EUV light 130 is collected and focused to a focal point such as focal point 118 of FIG. 1. In addition to the EUV light being undesirably "wasted" with respect to the lithography process if it passes back through the opening in the collector 114, the reflected light passes back through the opening (referred to as "lost EUV light") can also cause issues with the system 100. For example, the lost EUV light can be absorbed by nearby mirrors in the beam transport and/or focus system 106, which can create thermal dissipation and/or stabilization issues.

FIG. 2C illustrates that a portion of the laser 128 is also reflected back from the droplet 204, illustrated as 128'. The reflected laser 128' may be $CO_2$ laser reflection. In some embodiments, it may be desirable to reduce the reflection of the $CO_2$ laser from the droplet/mist 204 to avoid damage to the laser system (CO2 laser system) and/or EUV irradiation system. In some embodiments, the reflected beam 128' is reduced as compared to a reflected laser quantity if the droplet/mist 204 were to be struck by the laser 104 having the distribution 104A as the surface area of the interaction is increased as discussed above. FIG. 2C may occur contemporaneously with that of FIG. 2B.

It is noted that in FIGS. 2A, 2B, and 2C, the droplet/mist 204 is elliptical (also referred as a "pancake" shape) in the cross-sectional view. In other embodiments, the droplet 204 may be approximately spherical. The elliptical shape may be provided by introducing a pre-pulse of the laser (e.g., $CO_2$ laser) from source 102 prior to the introduction of a main-pulse of the laser. The pre-pulse may be used to shape the droplet 204 increasing the available surface area for impact with a subsequent main pulse (e.g., beam 128) of the laser. In some embodiments, the pre-pulse beam may have a Gaussian shape such as 104A. In a further embodiment, the main-pulse following the Gaussian pre-pulse may be provided as beam 128 having a ring-like in shape as illustrated in FIG. 2A. In some embodiments, the pre-pulse beam may also have a ring-like shape such as 128A. As such, in a further embodiment, each of the main-pulse and the pre-pulse may have a ring-like shape such as distribution 128A.

Figure 2D:
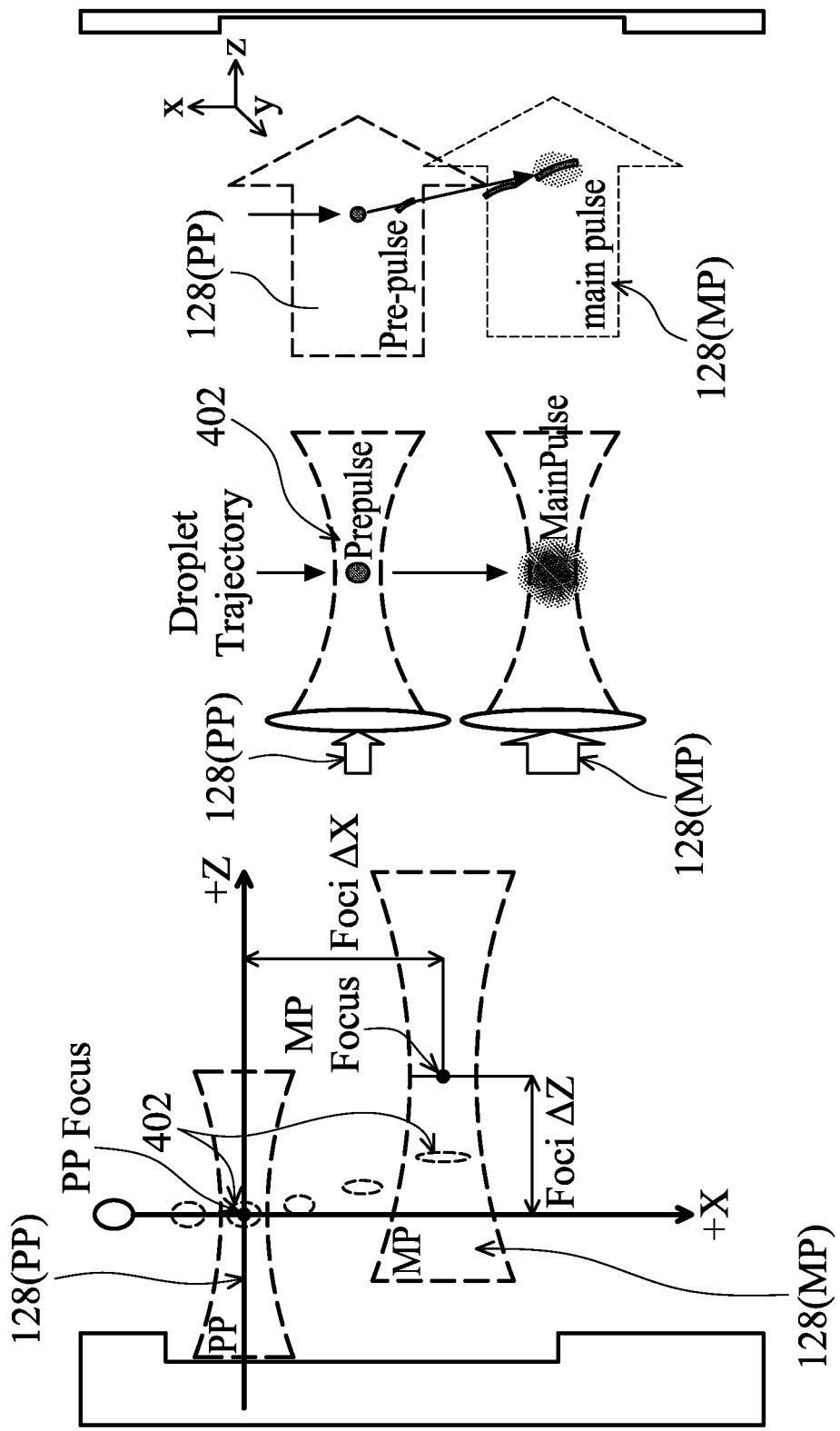

It is noted that FIGS. 2A, 2B, 2C provide a simplification in one or more aspects of providing a beam to a target droplet/mist. FIG. 2D is illustrative of the differing states and dispositions of the droplet 204 at pre-pulse and main pulse stages of the process. For example, the pre-pulse (PP) may be incident a droplet 204 in liquid droplet form, while the main pulse (MP) may be incident the droplet 204 after its expansion and when it is in mist form. In some embodiments, the droplet 204 has a trajectory between the PP and MP, for example, is disposed at a different location within the system.

With respect to one or more embodiments discussed herein and as discussed above, a pre-pulse (PP) maybe incident on a droplet 204, in its liquid form. Providing the shaped beam incident the liquid form droplet may provide for the droplet 204 to expand to the mist (e.g. from 30 micrometer to 300 micrometer in diameter). The main pulse of the laser (MP) (shaped) may then be incident the droplet 204 in mist form. If pre-pulse beam shape is ring-like or "donut" shaped when incident the droplet, the beam (e.g., $CO_2$ laser) reflection back to system can be lowered as illustrated above. If a main pulse (MP) shape is a "donut" shape when incident the droplet 204, then in expanding mist form, not only can the beam reflection (e.g., $CO_2$ laser) back to system become lower as discussed above, but in some embodiments the angular radiation pattern of generated EUV radiation can changed. This modification of shape can provide for one or more of (1) less EUV radiation waste due to collector central aperture, (2) less EUV radiation reflected back to irradiate on the last few mirrors (e.g., mirror 202), thereby providing an extended mirror lifetime with less thermal effect for operation, (3) more uniform angular distribution on collector surface, or (4) more surface area of droplet (e.g., mist) can be hit by a main pulse for more EUV irradiation as well as laser-to-EUV conversion efficiency.

Referring now to FIGS. 3A/3B, illustrated is an embodiment of the beam transport and focusing system 106 including the beam shaping unit 126. The beam transport and/or focus system 106 of FIGS. 3A/3B may be used in the EUV light source 100 of FIG. 1. The beam transport and/or focus system 106 includes a plurality of mirrors 302 which deflect and/or focus the laser beams. The mirrors 302 are exemplary only and not intended to be limiting in number, configuration, or arrangement.

Figure 3B:
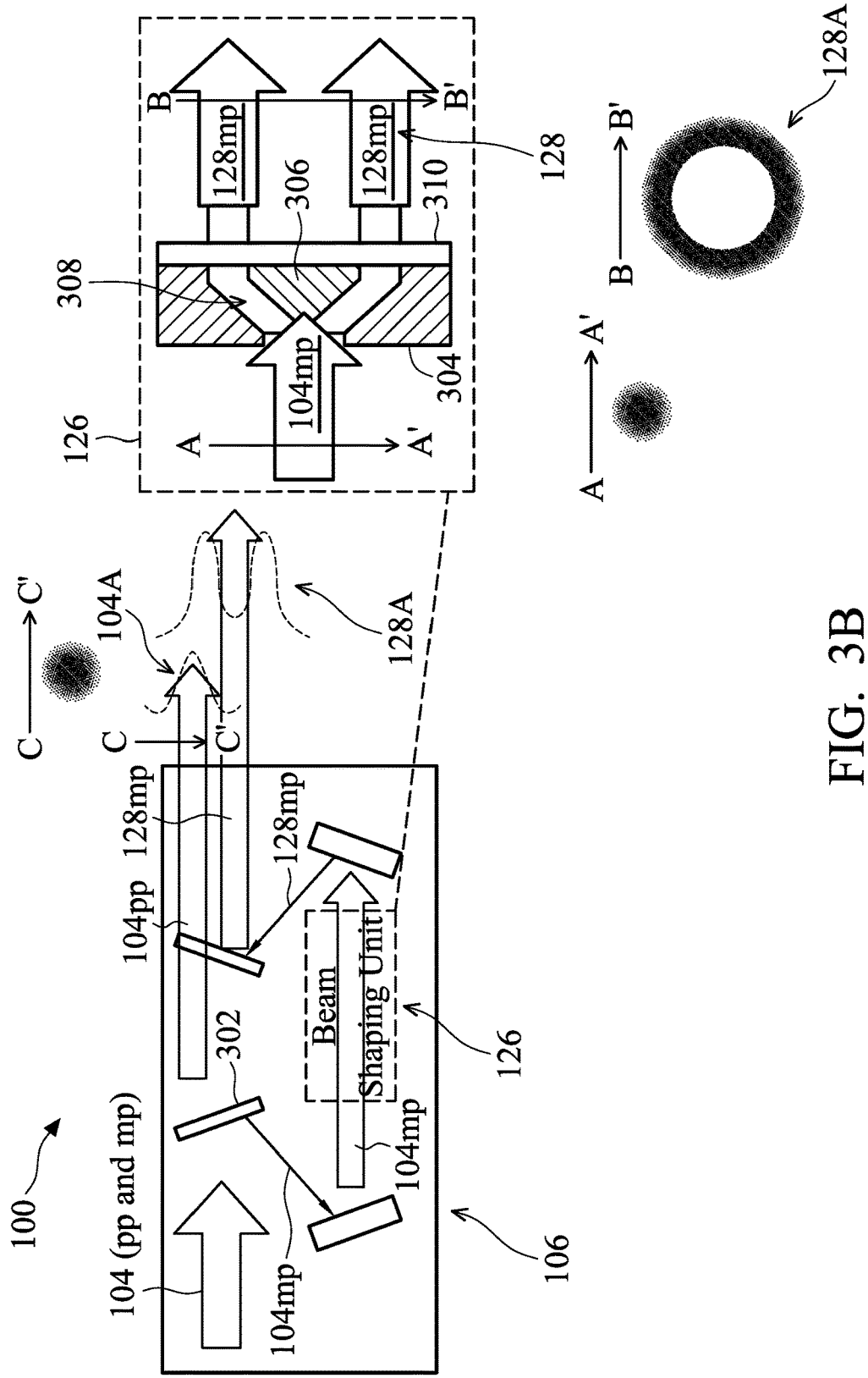

FIG. 3A illustrates a first embodiment of processing the main pulse and pre-pulse of the laser 104 using the beam transport and/or focus system 106. FIG. 3B illustrates a second embodiment of processing the main pulse and the pre-pulse of the laser 104 using the beam transport and/or focus system 106.

FIG. 3B illustrates in an embodiment, the mirrors 302 direct the main pulse of the laser beam 104 through the beam shaping unit 126, while the mirrors 302 direct the pre-pulse of the laser beam 104 such that it is not influenced by the beam shaping unit 126. Thus, the pre-pulse beam 104 may maintain its shape with a Gaussian distribution shape 104A when exiting the system 106 to the irradiation region 116. However, other embodiments are possible including where both the pre-pulse and the main pulse of the laser beam 104 are directed to and through the beam shaping unit 126 as illustrated in the embodiment of FIG. 3A. Here, as in FIG. 3A, the beam 128 may include a main pulse and/or a pre-pulse beam each having a distribution similar to 128A.

Regarding FIG. 3A/3B from a system implementation perspective, in an embodiment, the beam shaping unit 126 includes a reflaxicon as illustrated in FIGS. 3A/3B. The reflaxicon includes an outer-cone 304 and an inner-cone 306. The inner-cone 306 and the outer-cone 304 are disposed coaxially. A central opening 308 is created that defines an inner and outer diameter of the ring shape 128A. In some embodiments, a window 310 is disposed on the reflaxicon. The window 310 may include ZnSe, diamond, or other suitable material. The inner cone 306 may be mounted on the window 310. While a reflaxicon is one exemplary embodiment of a device that may be used to implement the shaping of the beam 104 to provide the shaped beam 128 implementation of other devices may also be possible including other reflective optics.

Figure 4:
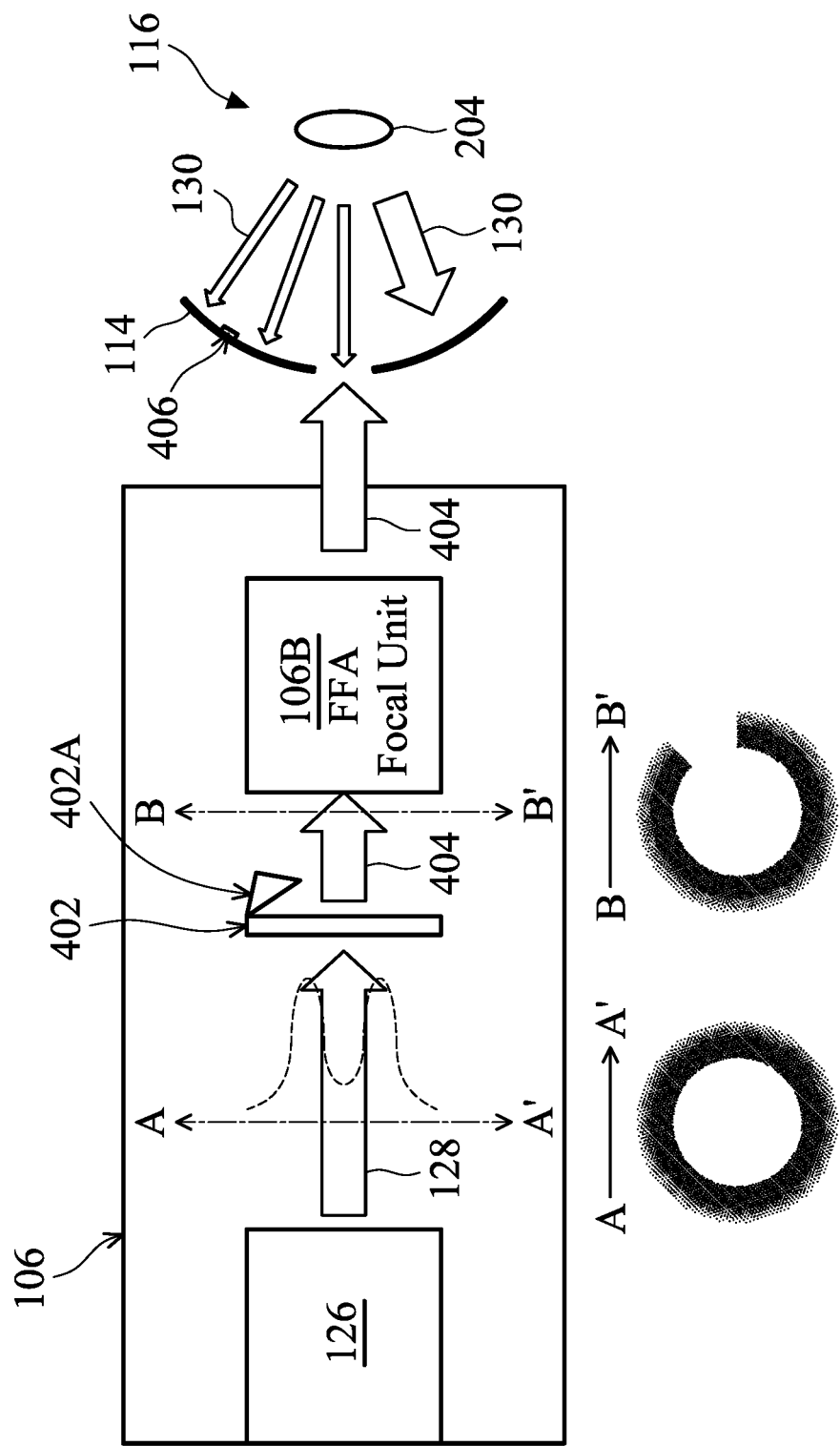
FIG. 4 is an exemplary schematic view of a further embodiment of a beam transport and/or focus system of an EUV light source system, in accordance with some embodiments.

Referring now to FIG. 4, illustrated is an embodiment of the beam transport and/or focus system 106 which may be used in the system 100 of FIG. 1 and/or include one or more elements of the beam transport and/or focus system 106 described above with reference to FIGS. 3A/3B. FIG. 4 illustrates for some embodiments a mask element 402 is included in the beam transport and/or focus system 106. In an embodiment, the mask element 402 is disposed after the beam shaping unit 126 and prior to a final focusing element 106B (referred to as Final Focal Assembly or FFA) of the beam transport and/or focus system 106. The mask element 402 is disposed such that it defines patterns to be applied to the beam 128 prior to the beam 128 being incident the droplet 204. The mask element 402 may include a mirror or other suitable material operable to deflect portions of a laser beam including wedges, beam dumps and other suitable materials. The patterned laser beam, subsequent passing through the mask element, is illustrated as patterned beam 404 having a distribution 404A in FIG. 4. The distribution 404A is exemplary only and in other embodiments other portions of the beam may be deflected or a plurality of portions of the beam may be deflected. In an embodiment, the mask element 402 includes a deflecting wedge 402A. The deflecting wedge 402A may act as a masking element deflecting portions of the beam. In an embodiment, the deflecting wedge 402A is operable to rotate to a position desired to deflect said portion of the beam. As discussed above, the mask element 402 may also include a beam dump. For example, in the illustration of FIG. 4, the wedge 402A may be positioned to deflect radiation from an upper right quadrant of the beam. In other embodiments, the wedge 402A may be rotated to other positions, e.g., rotated to "6 o'clock" using a clock as analogous to the beam shape to deflect a respective portion of the beam. In some embodiments, the mask element 402 may include air-cooled or water-cooled beam dumps. The beam dumps may be selected for the suitable wavelength of the incident beam. The wedge 402A may provide deflected beam portions to a corresponding beam dump.

In an embodiment, the pattern provided by the mask element 402 is determined by a process whereby a defect is identified on a collector, such as the collector 114, that is to be used in generating the EUV light source. The defect may be determined by inspection of the collector, analysis of data of EUV light generation performance, analysis of data as to implementation of the EUV light source in a lithography patterning process, and/or other suitable methods. In an embodiment, data collected on the performance of imaging a critical dimension (CD) feature or uniformity of CD features to be formed on a target substrate (e.g., wafer) is used to determine the presence of a defect on the collector. In some embodiments, an element (e.g., mirror) disposed in the system after the immediate focus point (e.g., 118) may be used to determine the presence of a defect on the collector. In an embodiment, the identification of the defect includes determining a coordinate of the defect on the collector. Using the example of FIG. 4, a defect 406 is identified. In an embodiment, the defect 406 is tin debris. In an embodiment, the defect 406 is damage to a surface of the collector 114.

After identifying the presence of the defect(s) such as defect 406, the pattern of the mask element 402 (including in some embodiments, wedge 402A) is designed, selected, and/or provided such that the EUV radiation generated from the laser beam impacting the droplet/mist 204 is decreased or eliminated in collector region having the defect while increased in non-defect regions. As illustrated in the embodiment of FIG. 4, the EUV light 130 is greater in a non-defect region than the region surrounding the defect 406 due to the patterning of the beam 128 to form the beam 404.

Figure 5:
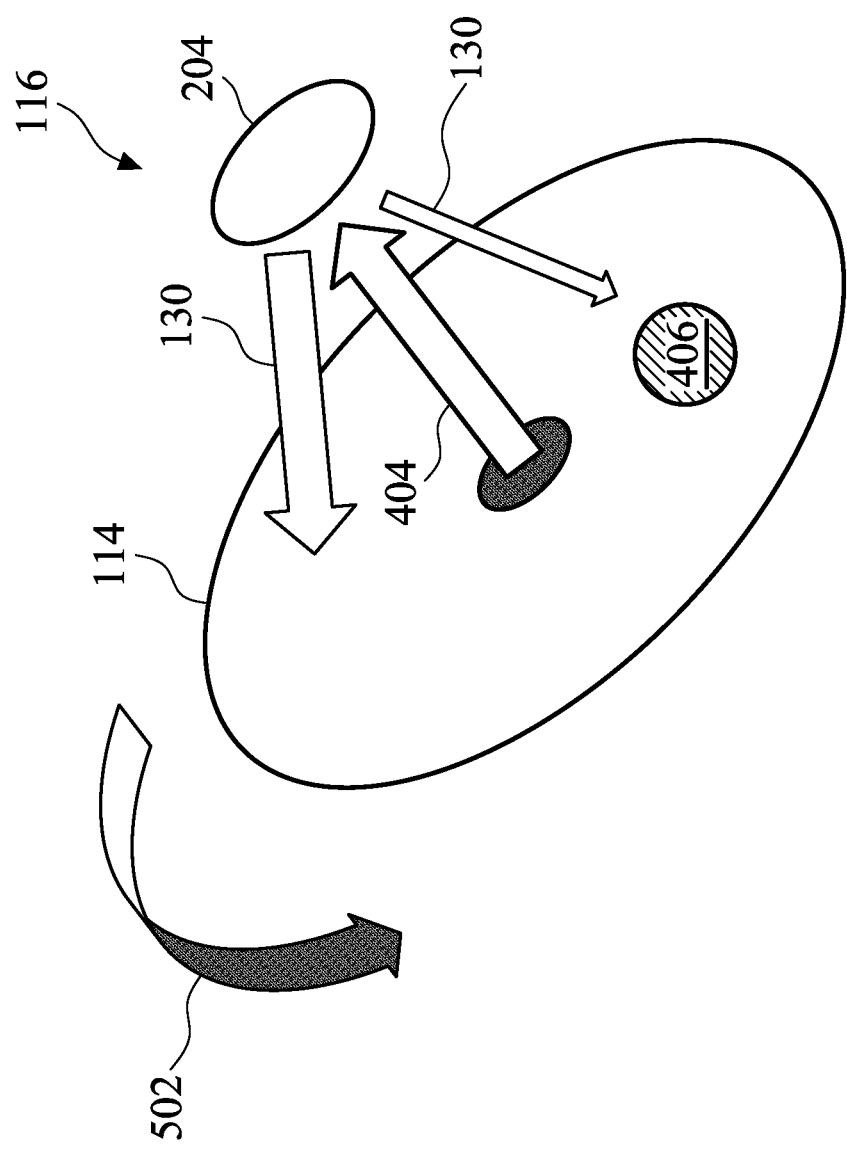
FIG. 5 is an exemplary schematic view of a collector of an EUV light source system, in accordance with some embodiments.

Referring now to FIG. 5, illustrated is an embodiment of a collector 114. The collector 114 of FIG. 5 may be implemented in the system 100 of FIG. 1, and or provided as the collector of the embodiments discussed above such as that of FIG. 2A, 2B, 2C, 3A, 3B, or 4. Illustrated in FIG. 5, a laser beam 404 is provided through the hole in the collector 114 to the irradiation region 116 where it is incident a droplet 204. The laser beam 404 may be shaped to be a ring-type beam, such as discussed above with reference to the laser beam 128. The laser beam 404 may also be patterned (e.g., via a mask element), such as discussed above with reference to the beam 404 of FIG. 4. As illustrated due to the modification of the shape of the beam 404, there is a greater generation of EUV light from the droplet 204 to be provided to a first region of the collector 114 (e.g., top of collector 114 relative to FIG. 5 orientation) than provided to a second region of the collector (e.g., bottom of the collector 114 relative to FIG. 5 orientation).

In some embodiments, the collector 114 is rotatable, as illustrated by exemplary rotation 502. In an embodiment, the collector 114 is azimuthally-rotatable. The rotation of the collector 114 may be used in conjunction with the patterning of the beam 404 by a mask element in order to achieve a greater percentage of EUV incident a defect-free portion of the collector 114 than a defect-containing portion of the collector 114. For example, the collector 114 is rotated such that the defect 406 is located away from a region of increased EUV light 130 generation.

Figure 6:
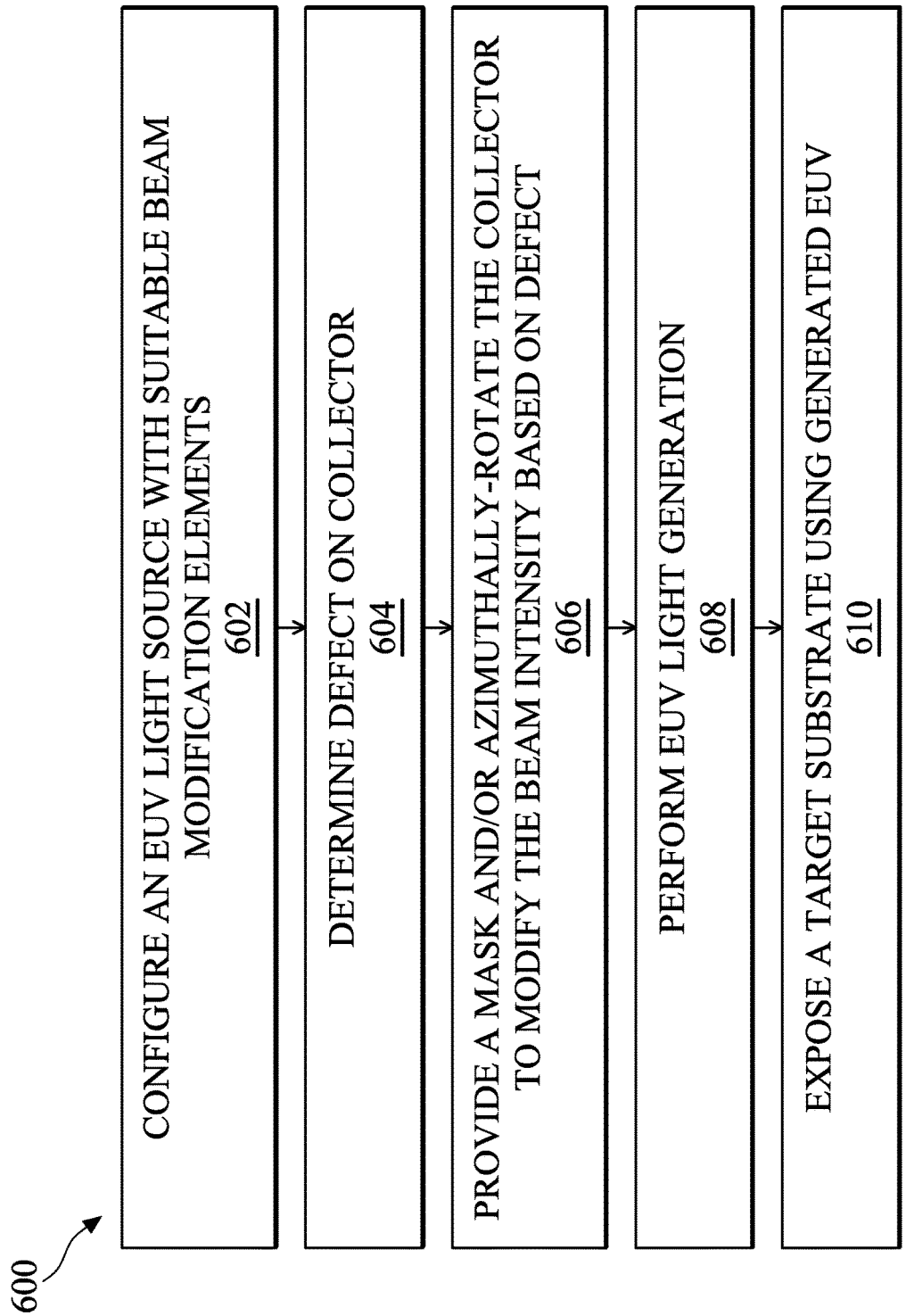
FIG. 6 is a flow chart of a method for generating EUV light and performing a lithography process using said EUV light, according to one or more aspects of the present disclosure.

Referring now to FIG. 6, illustrated is flow chart of a method 600 for modifying a laser beam to be used in an EUV light source, according to one or more aspects of the present disclosure. It is noted that the process steps of the method 600, including any descriptions given with reference to the figures, are merely exemplary and are not intended to be limiting beyond what is specifically recited in the claims that follow. Moreover, additional process steps may be implemented before, during, and after the method 600, and some process steps may be replaced or eliminated in accordance with various embodiments of the method 600.

The method 600 begins at block 602 where an EUV light source system is configured with suitable beam modification elements, according to one or more aspects of the present disclosure. The beam modification elements may be disposed in the light source system. By way of example, and in some embodiments, the EUV light source system may be the EUV light source system 100, as shown in FIG. 1. As such, in various embodiments, the EUV light source system may include beam modification elements such as the beam shaping unit discussed with reference to FIGS. 1, 2A, 2B, 2C, 3A, 3B, and 4; the masking element for patterning the beam discussed with reference to FIGS. 1, 4, and 5; the rotatable collector of FIGS. 1 and 6; and/or other suitable beam modification elements that provide for configuring the providing, reflection, or collection of a light (by manipulation of the laser beam, the EUV light, or the collector of the EUV light).

In an embodiment, the light source is configured such that a beam shaping unit is disposed in the path of the laser beam provided from a laser source. The beam shaping unit is disposed prior to the laser beam entering the irradiation region (e.g., prior to passing through the collector). The EUV light source may also be configured with other devices for shaping the laser beam such as, a mask element for patterning the laser beam. The mask element may be substantially similar to as discussed above with reference to FIG. 4. The EUV light source system may also be configured to allow for rotation of the collector before or during processing such as described above with reference to FIG. 5.

The method 600 then proceeds to block 604 where a defect is determined on the collector of the EUV light system. The defect may be determined by inspection of the collector, analysis of data of EUV light generation performance, analysis of data as to implementation of the EUV light source in a lithography patterning process, and/or other suitable methods. In an embodiment, data collected on the performance of imaging a critical dimension (CD) feature or uniformity of CD features on a target substrate (e.g., wafer) is used to determine the presence of a defect on the collector. In an embodiment, the identification of the defect includes determining a coordinate of the defect on the collector. In some embodiments, the method 600 may also be used to maintain collector operation lifetime as discussed herein.

In an embodiment of the method 600, block 604 is omitted and/or analysis is performed that provides that the collector does not include a defect requiring corrective action.

The method 600 then proceeds to block 606 where a mask element is provided and/or the collector is azimuthally-rotated to modify the beam intensity based on the presence of a defect determined in block 604. The mask element provided may be substantially similar to the mask element 402 discussed above with reference to FIG. 4. The collector may be rotated substantially similar to as discussed above with reference to FIG. 5. The block 606 may provide for increasing the beam intensity at a region of the collector spaced a distance from the defect, while decreasing the beam intensity at a region of the collector at the defect location.

In an embodiment of the method 600, block 606 is omitted.

The method 600 then proceeds to block 608 where EUV light is generated using the EUV light source provided in block 602. The EUV light may be generated by providing a laser beam that has been shape modified to provide a ring-like shape to a irradiation unit. In some embodiments, the laser beam is alternatively or additionally modified such that it is patterned. The laser beam may be patterned using the mask element such as discussed above. One or more of the shape modification and patterning may be performed prior to the laser beam being incident the droplet. In some embodiments, the collector is rotated before or during the provision of the laser beam as discussed above with reference to block 606 and/or with reference to FIG. 5. The provided laser beam (e.g., shape modified and/or patterned) generates reflected EUV light from the droplet. The reflected EUV light is collected by the collector and provided to a focal point. Subsequently, the reflected EUV light is provided to a EUV lithography system where it is used to pattern a target wafer as discussed below.

Figure 7:
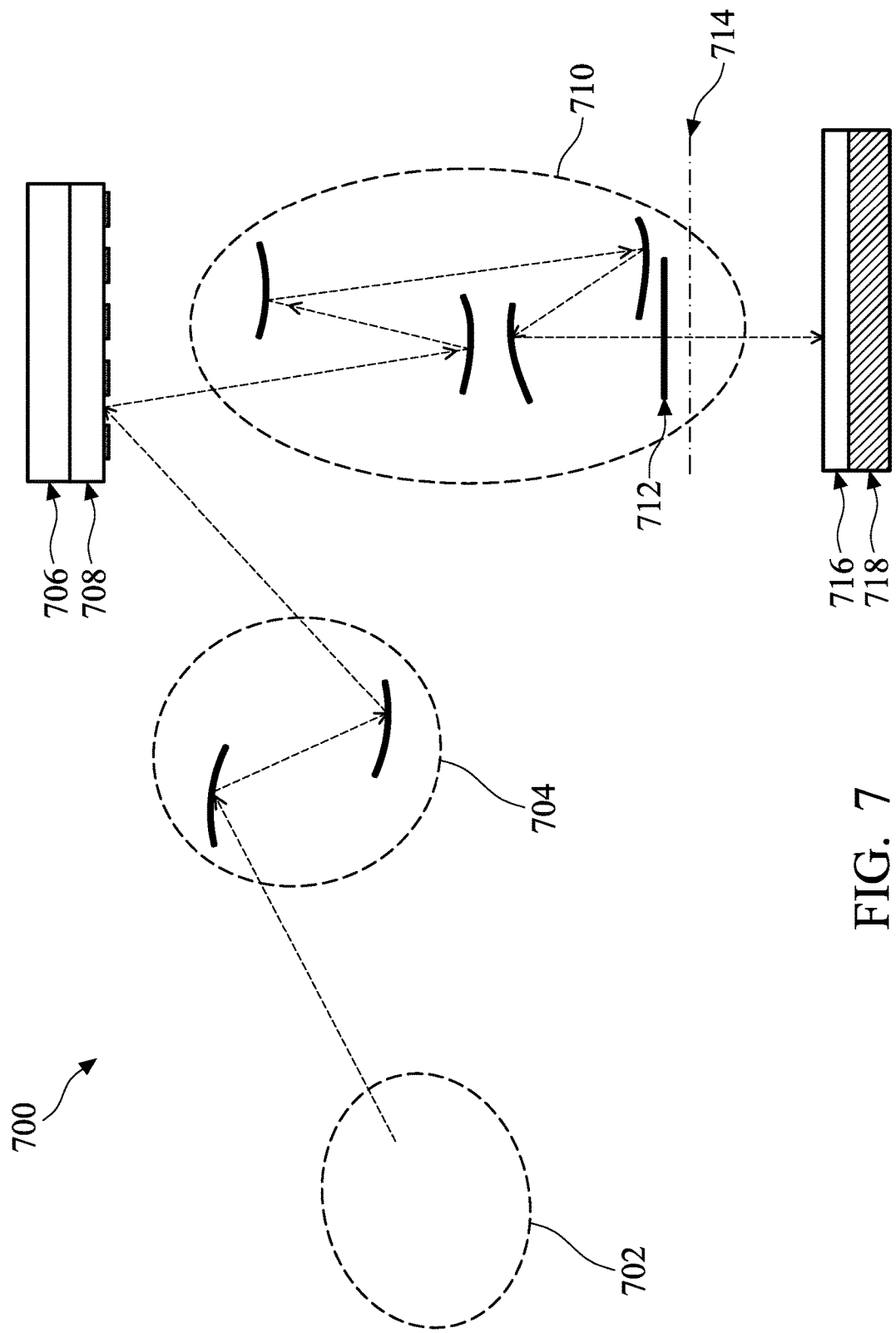
FIG. 7 is a schematic view of a lithography system, in accordance with some embodiments.

Referring now to block 610 of the method 600, as previously noted, the EUV light source described above may be used to provide an EUV light source for a lithography system. By way of illustration, and with reference to FIG. 7, provided therein is a schematic view of an exemplary lithography system 700, in accordance with some embodiments. The lithography system 700 may also be generically referred to as a scanner that is operable to perform lithographic processes including exposure with a respective radiation source and in a particular exposure mode. In at least some of the present embodiments, the lithography system 700 includes an extreme ultraviolet (EUV) lithography system designed to expose a resist layer by EUV light (e.g., provided via the EUV vessel). Inasmuch, in various embodiments, the resist layer includes a material sensitive to the EUV light (e.g., an EUV resist). The lithography system 700 of FIG. 7 includes a plurality of subsystems such as a radiation source 702 (e.g., such as the EUV light source 100 of FIG. 1), an illuminator 704, a mask stage 706 configured to receive a mask 708, projection optics 710, and a substrate stage 718 configured to receive a semiconductor substrate (e.g., wafer) 716. A general description of the operation of the lithography system 700 may be given as follows: EUV light from the radiation source 702 is directed toward the illuminator 704 (which includes a set of reflective mirrors) and projected onto the reflective mask 708. A reflected mask image is directed toward the projection optics 710, which focuses the EUV light and projects the EUV light onto the semiconductor substrate 716 to expose an EUV resist layer deposited thereupon. Additionally, in various examples, each subsystem of the lithography system 700 may be housed in, and thus operate within, a high-vacuum environment, for example, to reduce atmospheric absorption of EUV light.

In the embodiments described herein, the radiation source 702 may be substantially similar to the EUV light source 100 and/or may be more or more devices configured to receive EUV light from the EUV light source 100. As discussed above, the source may generate the EUV light using a laser produced plasma (LPP). In some examples, the EUV light produced and provided the system 700 may include light having a wavelength ranging from about 1 nm to about 100 nm. In one particular example, the radiation source 702 generates EUV light with a wavelength centered at about 13.5 nm.

Upon receipt, the EUV radiation (e.g., received/generated by the radiation source 702) is directed toward the illuminator 704. In some embodiments, the illuminator 704 may include reflective optics (e.g., for the EUV lithography system 700), such as a single mirror or a mirror system having multiple mirrors in order to direct light from the radiation source 702 onto the mask stage 706, and particularly to the mask 708 secured on the mask stage 706. In some examples, the illuminator 704 may include a zone plate, for example, to improve focus of the EUV light. In some embodiments, the illuminator 704 may be configured to shape the EUV light passing therethrough in accordance with a particular pupil shape, and including for example, a dipole shape, a quadrapole shape, an annular shape, a single beam shape, a multiple beam shape, and/or a combination thereof. In some embodiments, the illuminator 704 is operable to configure the mirrors (i.e., of the illuminator 704) to provide a desired illumination to the mask 708. In one example, the mirrors of the illuminator 704 are configurable to reflect EUV light to different illumination positions. In some embodiments, a stage prior to the illuminator 704 may additionally include other configurable mirrors that may be used to direct the EUV light to different illumination positions within the mirrors of the illuminator 704. In some embodiments, the illuminator 704 is configured to provide an on-axis illumination (ONI) to the mask 708. In some embodiments, the illuminator 704 is configured to provide an off-axis illumination (OAI) to the mask 708. It should be noted that the optics employed in the EUV lithography system 700, and in particular optics used for the illuminator 704 and the projection optics 710, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 700 also includes the mask stage 706 configured to secure the mask 708. Since the lithography system 700 may be housed in, and thus operate within, a high-vacuum environment, the mask stage 706 may include an electrostatic chuck (e-chuck) to secure the mask 708. As with the optics of the EUV lithography system 700, the mask 708 is also reflective. As illustrated in the example of FIG. 7, light is reflected from the mask 708 and directed towards the projection optics 710, which collects the EUV light reflected from the mask 708. By way of example, the EUV light collected by the projection optics 710 (reflected from the mask 708) carries an image of the pattern defined by the mask 708. In various embodiments, the projection optics 710 provides for imaging the pattern of the mask 708 onto the semiconductor substrate 716 secured on the substrate stage 718 of the lithography system 700. In particular, in various embodiments, the projection optics 710 focuses the collected EUV light and projects the EUV light onto the semiconductor substrate 716 to expose an EUV resist layer deposited on the semiconductor substrate 716. As described above, the projection optics 710 may include reflective optics, as used in EUV lithography systems such as the lithography system 700. In some embodiments, the illuminator 704 and the projection optics 710 are collectively referred to as an optical module of the lithography system 700.

In some embodiments, the lithography system 700 also includes a pupil phase modulator 712 to modulate an optical phase of the EUV light directed from the mask 708, such that the light has a phase distribution along a projection pupil plane 714.

As discussed above, the lithography system 700 also includes the substrate stage 718 to secure the semiconductor substrate 716 to be patterned. In various embodiments, the semiconductor substrate 716 includes a semiconductor wafer, such as a silicon wafer, germanium wafer, silicon-germanium wafer, III-V wafer, or other type of wafer as described above or as known in the art. The semiconductor substrate 716 may be coated with a resist layer (e.g., an EUV resist layer) sensitive to EUV light. To be sure, the lithography system 700 may further include other modules or subsystems which may be integrated with (or be coupled to) one or more of the subsystems or components described herein.

To be clear, the lithography system 700 is presented such that it is understood that the EUV light source system 100 may be used as the source 702 or provide the EUV radiation to the source 702 for use by the lithography system 700. That is, the system 100 provides the EUV radiation to an intermediate focal point 118, at which point it is transferred to the systems described in the lithography system 700.

The various embodiments described herein offer several advantages over the existing art. It will be understood that not all advantages have been necessarily discussed herein, no particular advantage is required for all embodiments, and other embodiments may offer different advantages. For example, by creating a ring-like pattern of the laser beam that is incident the target droplet, a greater surface area can be accessed. In some embodiments, providing a ring-like laser beam incident the target droplet generates a ring-like pattern of EUV emission that can be projected onto the collector surface. In some embodiments, this can decrease the lost in the system of EUV light by reducing the amount of EUV light that is lost through the aperture in the collector. In some embodiments, decreasing the amount of EUV lost can improve the efficiency of the system, reduce heat generation, provide for higher thermal stability, and/or other advantageous features. In some embodiments, by using a mask pattern and/or a rotatable collector, the far-field pattern can be optimized for better slit uniformity. In some embodiments presented, there may also be an increased life time of the collector device. This can be on account of the ability to continue to use the collector in creation of the EUV light despite the presence of a defect or debris as the EUV light can be directed away from the point of defect/debris. Example methods of directing the EUV light away from the defect/debris portion include use of a mask element and/or rotatable collector. It is noted that continuing to process with the debris/defect without accounting for the EUV light incident that debris/defect region can impact the performance of a lithography system such as the system 700 described above because the EUV light can be absorbed or not reflected by the debris/defect region.

Thus, one of the embodiments of the present disclosure a method includes providing a laser beam from a laser source. A shape of the laser beam is then modified. The modified beam is incident a tin droplet to generate an EUV light. This EUV light is reflected using a collector. In an embodiment, the modifying the shape of the laser beam includes providing a ring-profile laser beam. In embodiment, the providing the laser beam includes providing a Gaussian shaped beam. In an embodiment, the modifying of the shape is performed by a reflaxicon device. In an embodiment, the modifying the shape of the laser beam includes patterning the laser beam to block a first portion of the beam and maintain a second portion of the beam. In an embodiment, the patterning of the laser beam is performed by providing a mask element in a path of the laser beam. In an embodiment, the modifying the shape of the laser beam includes altering the laser beam from a Gaussian shape to a ring-like shape. In an embodiment, the modifying the shape further includes passing the ring-like shape beam through a mask element to block a portion of the ring-like shape beam. In an embodiment, the collector is rotated based on a location of the blocked portion of the ring-like shape beam. In an embodiment, a pattern for the mask element is selected using an analysis of a critical dimension (CD) feature on a target substrate.

In another of the embodiments, discussed is a method including providing a laser beam having a Gaussian distribution. The laser beam is modified from a Gaussian distribution to a ring-like distribution. The modified laser beam is provided through an aperture in a collector. The modified laser beam interfaces with a tin droplet, which generates an extreme ultraviolet (EUV) wavelength light. The generated EUV wavelength light is provided to the collector away from the aperture. In an embodiment, the laser beam is provided by a $CO_2$ laser source. In some embodiments, the tin droplet is in mist form; in some embodiments, the tin droplet is in liquid form; in some embodiments, the tin droplet is during the method at times in liquid form (e.g., PP) and at times in mist form (e.g., MP). In an embodiment, modifying the laser beam is performed by a reflaxicon. In an embodiment, a portion of the modified laser beam is blocked prior to interfacing the modified laser beam with the tin droplet. In an embodiment, the method includes rotating the collector. In an embodiment, modifying the laser beam includes modifying a main pulse of the laser beam while a pre-pulse of the laser beam is maintained as a Gaussian distribution when interfacing the tin droplet.

In yet another of the embodiments, discussed is an extreme ultraviolet (EUV) source system including a laser source operable to provide a laser beam, an irradiation region operable to receive a plurality of droplets for generating an EUV light, a collector operable to collect and reflect the EUV light from the plurality of droplets; and a reflaxicon interposing the laser source and the collector. In an embodiment, a mask element is disposed between the reflaxicon and the collector. In an embodiment, at least one mirror operable to focus the laser beam disposed between the mask element and the collector. In an embodiment, the collector is operable to be azimuthally-rotatable.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a laser beam from a laser source;
   modifying a shape of the laser beam to form a modified laser beam, wherein the modifying the shape of the laser beam includes altering the laser beam from a Gaussian shape to a ring-like shape;
   contacting a tin droplet with the modified laser beam to generate an EUV light; and
   reflecting the EUV light using a collector.

2. The method of claim 1, wherein the modifying the shape of the laser beam includes providing the ring-like shape by a reflaxicon device.

3. The method of claim 2, wherein the Gaussian shaped beam is incident a first end of the reflaxicon device.

4. The method of claim 2, wherein the ring-like shape is output a second end of the reflaxicon device.

5. The method of claim 1, wherein the modifying the shape of the laser beam includes patterning the laser beam to deflect a first portion of the laser beam and maintain a second portion of the laser beam, wherein the deflected first portion is deflected into a beam dump.

6. The method of claim 5, wherein the deflected first portion is deflected into the beam dump including a water cooled beam dump by a wedge.

7. The method of claim 1, wherein the modifying the shape further comprises: passing the laser beam having the ring-like shape through a mask element to deflect a portion of the laser beam having the ring-like shape.

8. The method of claim 7, further comprising:
rotating the collector based on a location of the deflected portion of the laser beam.

9. The method of claim 7, further comprising:
selecting a pattern for the mask element using an analysis of a critical dimension (CD) feature on a target substrate.

10. A method, comprising:
providing a laser beam having a Gaussian distribution;
modifying the laser beam from the Gaussian distribution to a ring-like distribution;
providing the modified laser beam through an aperture in a collector plate;
interfacing the modified laser beam with a tin droplet, wherein the interfacing generates an extreme ultraviolet (EUV) wavelength light; and
wherein the generated EUV wavelength light is provided to the collector plate away from the aperture.

11. The method of claim 10, wherein the tin droplet is in mist form.

12. The method of claim 10, wherein the modifying the laser beam is performed by a reflaxicon.

13. The method of claim 10, further comprising:
deflecting a portion of the modified laser beam prior to interfacing the modified laser beam with the tin droplet.

14. The method of claim 10, further comprising:
rotating the collector plate.

15. The method of claim 10, wherein the modifying the laser beam includes modifying a main pulse of the laser beam and wherein a pre-pulse of the laser beam is maintained as a Gaussian distribution when interfacing the tin droplet.

16. An extreme ultraviolet (EUV) source system, comprising:
a laser source operable to provide a laser beam;
an irradiation region operable to receive a plurality of droplets for generating an EUV light;
a collector operable to collect and reflect the EUV light from the plurality of droplets; and
a reflaxicon interposing the laser source and the collector, wherein the reflaxicon includes a first portion and a second portion and an opening defined between the first and second portions, wherein the opening defines an inner diameter and outer diameter of a ring-shape.

17. The EUV source system of claim 16, further comprising:
a mask element between the reflaxicon and the collector.

18. The EUV source system of claim 17, at least one mirror operable to focus the laser beam disposed between the mask element and the collector.

19. The EUV source system of claim 16, wherein the collector is operable to be azimuthally-rotatable.

20. The EUV source system of claim 16, wherein the first portion is an inner cone and the second portion is an outer cone, the inner and outer cones disposed coaxially.

* * * * *